(12) United States Patent
Rietman et al.

(10) Patent No.: US 9,523,718 B2
(45) Date of Patent: Dec. 20, 2016

(54) DISAGGREGATION APPARATUS FOR IDENTIFYING AN APPLIANCE IN AN ELECTRICAL NETWORK

(75) Inventors: Ronald Rietman, Eindhoven (NL); Alessio Filippi, Eindhoven (NL); Ashish Vijay Pandharipande, Eindhoven (NL); Ying Wang, Eindhoven (NL); Paul Anthony Shrubsole, Arnhem (NL)

(73) Assignee: PHILIPS LIGHTING HOLDING B.V., Eindhoven (NL)

( * ) Notice: Subject to any disclaimer, the term of this patent is extended or adjusted under 35 U.S.C. 154(b) by 147 days.

(21) Appl. No.: 13/825,229

(22) PCT Filed: Sep. 13, 2011

(86) PCT No.: PCT/IB2011/053996
§ 371 (c)(1),
(2), (4) Date: Mar. 20, 2013

(87) PCT Pub. No.: WO2012/038858
PCT Pub. Date: Mar. 29, 2012

(65) Prior Publication Data

US 2013/0187665 A1    Jul. 25, 2013

(30) Foreign Application Priority Data

Sep. 22, 2010    (EP) ..................................... 10178299

(51) Int. Cl.
*G01R 15/00*    (2006.01)
*G01R 19/25*    (2006.01)
(Continued)

(52) U.S. Cl.
CPC .............. *G01R 15/002* (2013.01); *G01D 4/002* (2013.01); *G01R 19/2513* (2013.01);
(Continued)

(58) Field of Classification Search
CPC .............. G01R 15/002; G01R 19/2519; G01R 19/2513; G01R 19/253; G01R 19/02; G01R 35/00; G01R 35/04; G01R 21/133; G01R 11/00; G01R 11/56; G01R 22/00; G01R 22/06; G01R 22/10; G01D 4/002; G01D 4/00; G06F 1/226; H02J 13/00; H02J 3/00; H01H 9/167
(Continued)

(56) References Cited

U.S. PATENT DOCUMENTS 4,858,141 A  *  8/1989  Hart et al. ...................... 702/61
5,483,153 A  *  1/1996  Leeb et al. .................. 324/76.12
(Continued)

FOREIGN PATENT DOCUMENTS

JP    2003333768 A    11/2003
JP    2004056969 A    2/2004
(Continued)

OTHER PUBLICATIONS

Robert Cox et al; "Transient Event Detection for Nonintrusive Load Monitoring and Demand Side Management Using Voltage Distortion", IEEE , 2006, pp. 1751-1757.
(Continued)

*Primary Examiner* — Melissa Koval
*Assistant Examiner* — Felicia Farrow

(57) ABSTRACT

The invention relates to a disaggregation apparatus for identifying an appliance in an electrical network (2) comprising multiple appliances (3, 4, 5). A voltage meter (7) measures a first change in a mains voltage (V) delivered to the appliances of the electrical network, while an operational state of an appliance is modified, and a second change in the mains voltage, while a switchable load is switched. An appliance determination unit (9) determines the appliance, of which the operational state has been changed, based on
(Continued)

the measured first change in the mains voltage, the measured second change in the mains voltage and the resistance of the switchable load. Thus, an appliance can be determined without detecting switching flickers in very short time durations, i.e. high sampling rates and continuous monitoring are not necessarily required. This reduces the technical efforts of the disaggregation apparatus for performing the disaggregation function.

9 Claims, 2 Drawing Sheets

(51) Int. Cl.
  *H02J 13/00* (2006.01)
  *G01D 4/00* (2006.01)
  *H02J 3/00* (2006.01)
(52) U.S. Cl.
  CPC ............... *H02J 13/00* (2013.01); *H02J 3/00* (2013.01); *Y02B 90/241* (2013.01); *Y04S 20/32* (2013.01); *Y04S 20/38* (2013.01)
(58) Field of Classification Search
  USPC .......................................................... 324/603
  See application file for complete search history.

(56) References Cited

U.S. PATENT DOCUMENTS

| | | | | |
|---|---|---|---|---|
| 6,081,123 A | * | 6/2000 | Kasbarian | H02J 13/0048 324/521 |
| 7,693,670 B2 | * | 4/2010 | Durling | G01D 4/008 702/61 |
| 8,156,055 B2 | * | 4/2012 | Shimada | H02J 13/0079 706/12 |
| 2006/0119368 A1 | * | 6/2006 | Sela et al. | 324/522 |
| 2009/0062970 A1 | | 3/2009 | Forbes, Jr. | |
| 2009/0072985 A1 | | 3/2009 | Patel et al. | |
| 2009/0088991 A1 | * | 4/2009 | Brzezowski et al. | 702/62 |
| 2009/0195349 A1 | * | 8/2009 | Frader-Thompson et al. | 340/3.1 |
| 2010/0070224 A1 | * | 3/2010 | Hyde | G01R 19/2513 702/75 |
| 2011/0251807 A1 | * | 10/2011 | Rada | G01D 4/00 702/61 |

FOREIGN PATENT DOCUMENTS

JP          2005354794 A    12/2005
JP          04858141 B2     1/2012

OTHER PUBLICATIONS

Shwetak N. Patel; "At the Flick of a Switch: Detecting and Classifying Unique Electrical Events on the Residential Power Line", Sep. 16, 2007, UBICOMP 2007: Ubiquitous Computing; lECTURE Notes in Computer Science, Springer Berlin Heidelberg, Berlin, vol. 4717, pp. 271-288, XP019070904.

G. W. Hart; "Nonintrusive Appliance Load Monitoring", Proceedings of the IEEE, IEEE, New York, US, vol. 80, No. 12, Dec. 1, 1992, pp. 1870-1891, XP000336363.

* cited by examiner

DISAGGREGATION APPARATUS FOR IDENTIFYING AN APPLIANCE IN AN ELECTRICAL NETWORK

FIELD OF THE INVENTION

The invention relates to a disaggregation apparatus, a disaggregation method and a disaggregation computer program for identifying an appliance in an electrical network. The invention relates further to a system comprising the electrical network and the disaggregation apparatus for identifying an appliance in the electrical network.

BACKGROUND OF THE INVENTION

The article "At the Flick of a Switch: Detecting and Classifying Unique Electrical Events on the Residential Power Line" by Shwetak N. Patel et al., UbiComp 2007, Lecture Notes in Computer Science, Volume 4717, pages 271 to 288, 2007 discloses a disaggregation apparatus for identifying an appliance in an electrical network, which uses the mains voltage delivered to the appliances only. However, the method relies on detecting and classifying switching flickers that have very short time durations, and as such require high sampling rates and continuous monitoring.

The technical efforts for performing the disaggregation function are therefore relatively high.

SUMMARY OF THE INVENTION

It is an object of the present invention to provide a disaggregation apparatus, a disaggregation method and a disaggregation computer program for identifying an appliance in an electrical network, wherein the technical efforts needed for performing the disaggregation function can be reduced. It is a further object of the present invention to provide a system comprising the electrical network and the disaggregation apparatus for identifying an appliance in the electrical network.

In a first aspect of the present invention a disaggregation apparatus for identifying an appliance in an electrical network is presented, which comprises multiple appliances and which is powered by a power source, wherein the disaggregation apparatus comprises:
- a voltage meter for measuring a first change in a mains voltage delivered to the appliances of the electrical network, while an operational state of an appliance is modified,
- a controller for switching a switchable load, wherein the voltage meter is adapted to measure a second change in the mains voltage delivered to the appliances of the electrical network, while the switchable load is switched,
- an appliance determination unit for determining the appliance, of which the operational state has been changed, based on the measured first change in the mains voltage, the measured second change in the mains voltage and the resistance of the switchable load.

Since the appliance determination unit just needs the measured first change in the mains voltage, the measured second change in the mains voltage and the switchable load for determining the appliance, it is not necessary to detect switching flickers in very short time durations, i.e. high sampling rates and continuous monitoring are not necessarily required. This reduces the technical efforts of the disaggregation apparatus for performing the disaggregation function.

The appliances and the switchable load are preferentially parallely connected in the electrical network.

It is preferred that the appliance determination unit is adapted to determine a change in a total admittance of the electrical network of the appliances based on the measured first change in the mains voltage, the measured second change in the mains voltage and the resistance of the switchable load, and to determine the appliance, of which the operational state has been changed, based on the determined change in total admittance. It is further preferred that the appliance determination unit is adapted to determine the change in the total admittance from the measured first change in the mains voltage and from a ratio of a voltage supplied by the power source and an impedance of the electrical network, wherein the ratio is determined from the measured second change in the mains voltage and the resistance of the switchable load. Preferentially, the appliance determination unit is adapted to determine from the measured first change in the mains voltage a first change in the reciprocal mains voltage, and to determine the change in the total admittance depending on the product of the ratio and the first change in the reciprocal mains voltage. The change in the total admittance is indicative of the respective appliance, of which the operational state has been changed. Preferentially, the appliance determination unit comprises a memory, in which characteristics of admittances of the appliances of the electrical network are stored. By comparing the determined change in total admittance with the stored characteristics the appliance, of which the operational state has been modified, can be determined.

It is further preferred that the appliance determination unit is adapted to determine from the measured second change in the mains voltage a second change in the reciprocal mains voltage, and to determine the ratio depending on the product of the resistance of the switchable load and the second change in the reciprocal mains voltage. This allows determining the ratio very simply by just switching the load, measuring the second change in the mains voltage and by performing simple mathematics.

It is preferred that the voltage meter is adapted for measuring the mains voltage delivered to the appliances of the electrical network over time for measuring a time-depending mains voltage, wherein the appliance determination unit is adapted to
- determine the total admittance of the electrical network of appliances over time from the measured time-dependent mains voltage for determining a time-dependent total admittance, and
- determine the energy consumption of the appliance, of which the operational state has been modified, from the determined time-dependent total admittance and the determined time-dependent mains voltage. In particular, the appliance determination unit is adapted to determine the energy consumption of the appliance depending on an integral over time of a product of the squared time-dependent mains voltage and the time-dependent total admittance. Thus, the appliance determination unit can not only determine the appliance, of which the operational state has been changed, but also the energy consumption of this appliance.

The disaggregation apparatus can comprise the switchable load. However, the switchable load can also be any other load having a known resistance. For example, the switchable load can also be one of the appliances of the electrical network.

In an embodiment, the voltage meter is adapted to measure the first change in the mains voltage delivered to the appliances of the electrical network, while the operational state of the appliance is modified, at a mains voltage frequency and to measure a first additional change of voltage in the electrical network, while the operational state of the appliance is modified, at an additional frequency being different to the mains frequency, and the appliance determination unit is adapted to determine the appliance, of which the operational state has been changed, based on the measured first change in the mains voltage, the measured first additional change of voltage in the electrical network, the measured second change in the mains voltage and the resistance of the switchable load. The voltage meter can further be adapted to measure the second change in the mains voltage delivered to the appliances of the electrical network, while the switchable load is switched, at the mains voltage frequency and to measure a second additional change of voltage in the electrical network, while the operational state of the switchable load is switched, at the additional frequency, wherein the appliance determination unit is adapted to determine the appliance, of which the operational state has been changed, based on the measured first change in the mains voltage, the measured first additional change of voltage in the electrical network, the measured second change in the mains voltage, the measured second additional change of voltage in the electrical network and the resistance of the switchable load. The disaggregation apparatus can comprise a current generation unit for generating a current in the electrical network at the additional frequency. In particular, the appliance determination unit can be adapted to determine the change in the total admittance at the mains voltage frequency and at the additional frequency and to determine the appliance, of which the operational state has been changed, based on the change in total admittance determined at the mains voltage frequency and the additional frequency. This allows determining the appliance, of which the operational state has been changed, based on the frequency dependence of the determined change in total admittance. The frequency dependence of the change in the total admittance can be indicative of the respective appliance, of which the operational state has been changed. The appliance determination unit can comprise a memory, in which frequency dependencies of appliances of the electrical network are stored. By comparing the frequency dependence of the change of the total admittance with the stored frequency dependencies of the admittances of the appliances, one or several appliances can be determined, of which the operational state has been modified.

The current generation unit can be an additional power source, which is connected to the electrical network for supplying voltage and, thus, current to the appliances at the additional frequency. The current generation unit can be adapted to generate a sine-wave current. However, the current generation unit can also be a DC current source that is repeatedly switched on and off.

In another aspect of the present invention a system comprising an electrical network, which comprises multiple appliances and which is powered by a power source, and a disaggregation apparatus for indentifying an appliance in the electrical network as defined in claim 1 is presented.

In another aspect of the present invention a disaggregation method for indentifying an appliance in an electrical network, which comprises multiple appliances and which is powered by a power source, is presented, wherein the disaggregation method comprises:

measuring a first change in a mains voltage delivered to the appliances of the electrical network, while an operational state of an appliance is modified, measuring a second change in the mains voltage delivered to the appliances of the electrical network, while a switchable load is switched, determining the appliance, of which the operational state has been changed, based on the measured first change in the mains voltage, the measured second change in the mains voltage and the resistance of the switchable load.

In another aspect of the present invention a disaggregation computer program for identifying an appliance in an electrical network is presented, which comprises multiple appliances and which is powered by a power source, wherein the computer program comprises program code means for causing a disaggregation apparatus as defined in claim 1 to carry out the steps of the disaggregation method as defined in claim 13, when the computer program is run on a computer controlling the disaggregation apparatus.

It shall be understood that the disaggregation apparatus of claim 1, the system of claim 12, the disaggregation method of claim 13 and the disaggregation computer program of claim 14 have similar and/or identical preferred embodiments as defined in the dependent claims.

It shall be understood that a preferred embodiment of the invention can also be any combination of the dependent claims with the respective independent claim.

These and other aspects of the invention will be apparent from and elucidated with reference to the embodiments described hereinafter.

DETAILED DESCRIPTION OF EMBODIMENTS

Figure 1:
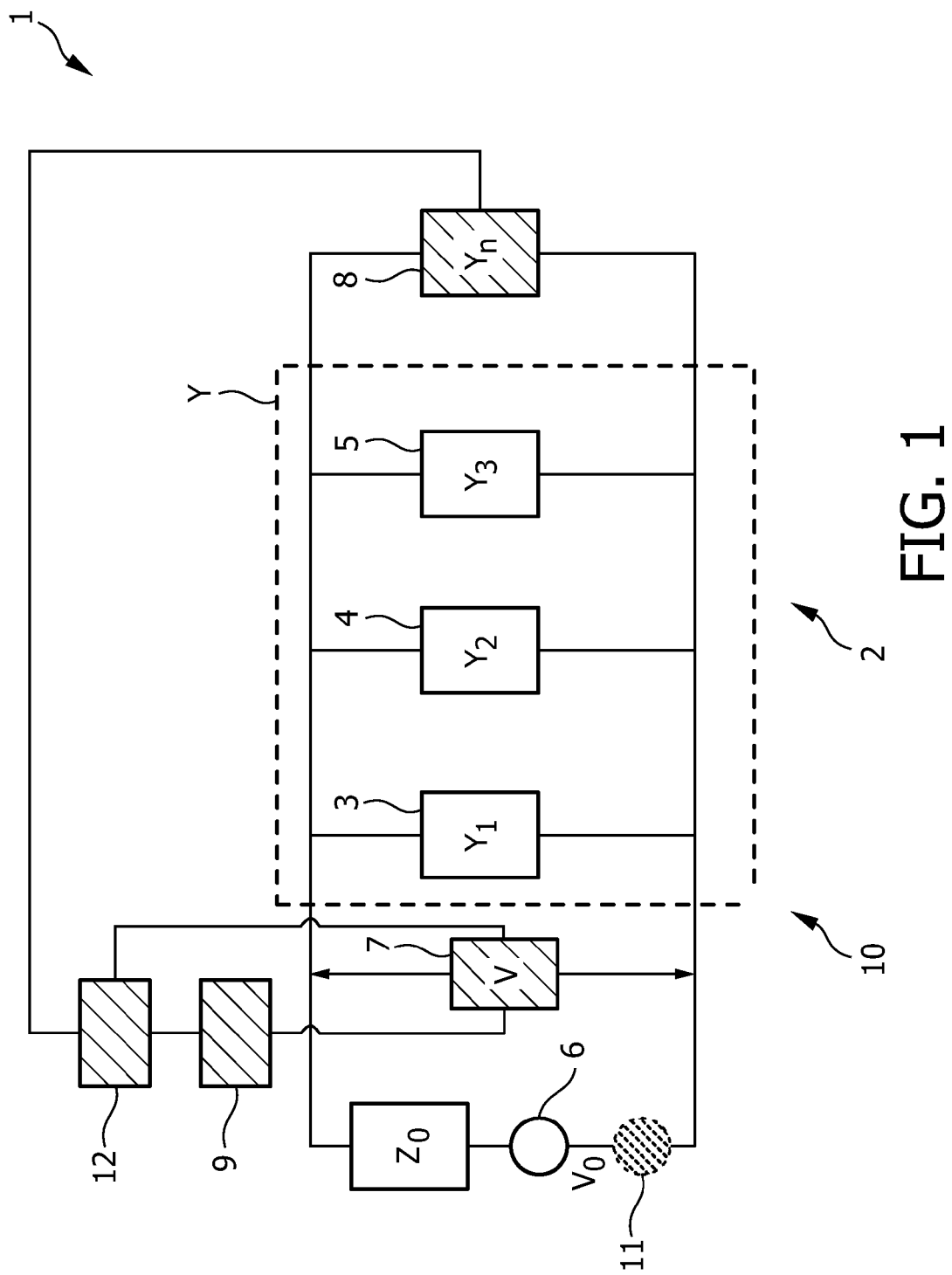
FIG. 1 shows schematically and exemplarily an embodiment of a disaggregation apparatus for identifying an appliance in an electrical network.

FIG. 1 shows schematically and exemplarily a system 10 comprising an electrical network 2 and a disaggregation apparatus 1 for identifying an appliance in the electrical network 2. The electrical network 2 comprises multiple appliances 3, 4, 5 which are powered by a power source 6. In FIG. 1, the elements of the disaggregation apparatus 1 are shaded.

The disaggregation apparatus 1 comprises a voltage meter 7 for measuring a first change in a mains voltage V delivered to the appliances 3, 4, 5 of the electrical network 2, while an operational state of an appliance is modified. The disaggregation apparatus 1 further comprises a switchable load 8, wherein the voltage meter 7 is adapted to measure a second change in the mains voltage V delivered to the appliances 3, 4, 5 of the electrical network 2, while the switchable load 8 is switched. The disaggregation apparatus 1 further comprises an appliance determination unit 9 for determining the appliance, of which the operational state has been changed, based on the measured first change in the mains voltage V, the measured second change in the mains voltage V and the resistance R of the switchable load 8. The appliances 3, 4, 5 and the switchable load 8 are parallelly connected in the electrical network 2.

The disaggregation apparatus 1 further comprises a controller 12 for controlling the elements of the disaggregation apparatus 1, in particular, for controlling the voltage meter 7, the switchable load 8 and the appliance determination unit 9.

In this embodiment, the appliance determination unit 9 is adapted to determine a change ΔY in a total admittance Y of the electrical network 2 of the appliances 3, 4, 5 based on the measured first change in the mains voltage V, the measured second change in the mains voltage V and the resistance R of the switchable load 8, and to determine the appliance, of which the operational state has been changed, based on the determined change ΔY in total admittance. In particular, the appliance determination unit 9 is adapted to determine the change ΔY in total admittance from the measured first change in the mains voltage V and from a ratio of a voltage $V_0$ supplied by the power source 6 and an impedance $Z_0$ of the electrical network 2, wherein the ratio is determined from the measured second change in the mains voltage V and the switchable load. Preferentially, the admittance appliance determination unit 9 is adapted to determine from the measured first change in the mains voltage V a first change $\Delta_1(1/V)$ in the reciprocal mains voltage 1/V, and to determine the change ΔY in the total admittance Y depending on the product of the ratio and the first change $\Delta_1(1/V)$ in the reciprocal mains voltage 1/V, in accordance with following equation:

$$\Delta Y = (V_0/Z_0)\Delta_1(1/V). \tag{1}$$

The total admittance Y is the sum of the admittances $Y_1$, $Y_2$, $Y_3$ of the appliances 3, 4, 5 of the electrical network 2. This is indicated in FIG. 1 by the dashed box with the reference sign Y. Preferentially, the electrical network is adapted such that losses in the network between different appliances are negligible. Moreover, preferentially the voltage $V_0$ supplied by the power source 6 and the internal impedance $Z_0$ of the network are constant.

If an appliance changes its operational state, for example, is switched on or off, the total admittance Y changes, wherein the change in total admittance is preferentially determined in accordance with equation (1).

The appliance determination unit 9 is adapted to determine from the measured second change in the mains voltage V a second change $\Delta_2(1/V)$ in the reciprocal mains voltage 1/V and to determine the ratio depending on the product of the resistance $R=1/Y_n$ of the switchable load 8 and the second change $\Delta_2(1/V)$ in the reciprocal mains voltage in accordance with following equation.

$$V_0/Z_0 = \pm 1/(R\Delta_2(1/V)) \tag{2}$$

wherein the sign "+" indicates that the load 8 is switched on and the sign "−" indicates that the load 8 is switched off. Thus, the switchable load 8 is switched on or switched off and the ratio $V_0/Z_0$ is determined in accordance with equation (2).

The disaggregation apparatus 1 can be adapted to switch the switchable load, measure the corresponding second change in the reciprocal main voltage and determine the ratio $V_0/Z_0$ repeatedly at regular intervals or on demand, for example, on demand of a user, in order to update the determination of the ratio $V_0/Z_0$. This update is particularly preferred, if the electrical network 2 is not very stable and if, thus, the ratio varies.

Figure 2:
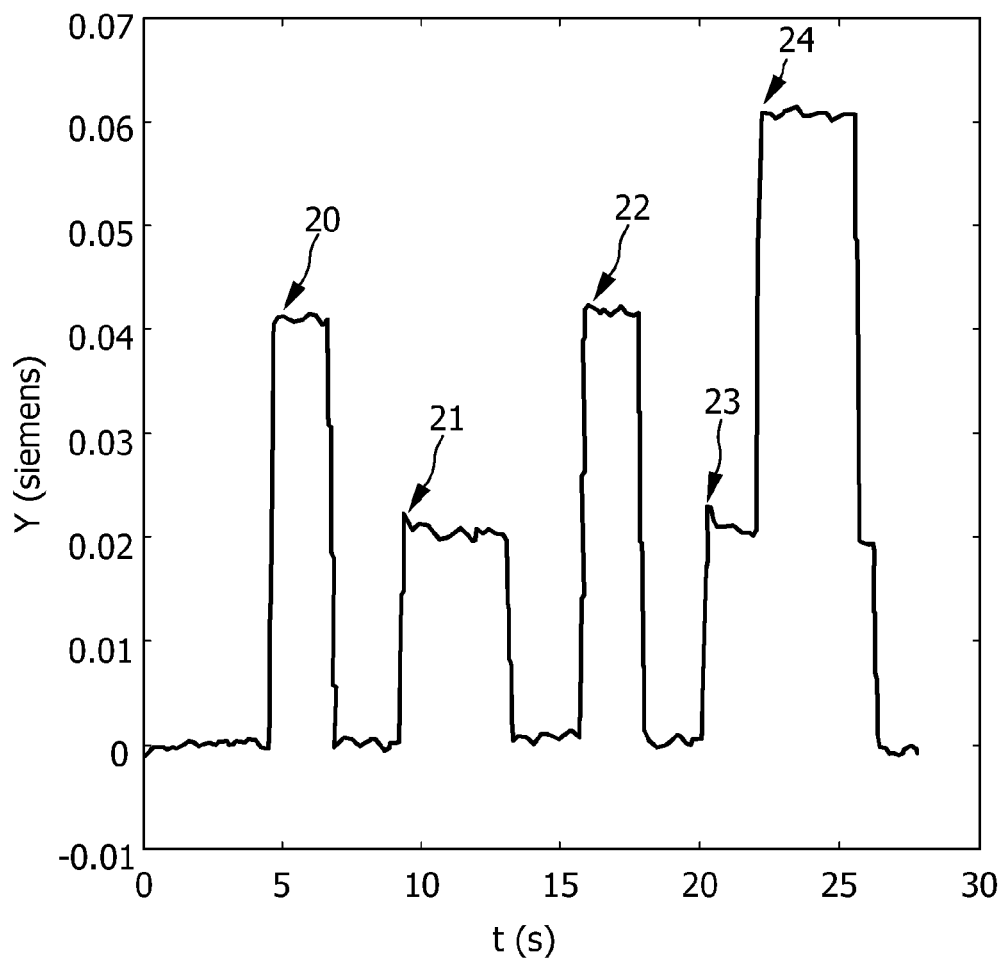
FIG. 2 shows schematically a total admittance of several appliances of the electrical network, while the appliances are switched on and off.

FIG. 2 shows schematically and exemplarily the total admittance Y in siemens, which has been determined in accordance with equation (1), versus time. In this example, a first appliance 3 has an admittance $Y_1$ of 0.04 siemens and a second appliance 4 has an admittance $Y_2$ of 0.02 siemens. At the locations indicated in FIG. 2 by reference numbers 20, 22 the first appliance 3 is switched on leading to a change in total admittance of about 0.04 siemens. Since it is known that the first appliance 3 has an admittance of 0.04, it can be determined that this change in total admittance is caused by switching on the first appliance 3. At the locations indicated in FIG. 2 by reference numbers 21, 23, the change in total admittance is about 0.02 siemens. Since it is known that the second appliance 4 has an admittance of 0.02 siemens, it can be determined that this change in the total admittance is caused by switching on the second appliance 4. At the location in FIG. 2 indicated by reference number 24 a change of total admittance of about 0.06 siemens has been measured. Since it is known that the first appliance has an admittance of 0.04 siemens and the second appliance has an admittance of 0.02 siemens, it can be determined that this change in total admittance is caused by switching on the first appliance 3 and the second appliance 4.

The change in the total admittance Y is therefore indicative of the respective appliance, of which the operational state has been changed. The appliance determination unit 9 comprises therefore a memory, in which characteristics of admittances of the appliances 3, 4, 5 of the electrical network 2 are stored. For example, the admittances $Y_1$, $Y_2$, $Y_3$ of the appliances 3, 4, 5 can be stored in the memory of the appliance determination unit 9. By comparing the change in the determined total admittance Y with the stored characteristics the appliance, of which the operational state has been modified, can be determined.

The voltage meter 6 is preferentially adapted for measuring the mains voltage V delivered to the appliances 3, 4, 5 of the electrical network 2 over time for measuring a time-depending mains voltage V(t), wherein the appliance determination unit 9 is preferentially adapted to determine the total admittance Y of the electrical network 2 of appliances 3, 4, 5 over time from the measured time dependent-mains voltage V(t) for determining a time-dependent total admittance Y(t) and to determine the energy consumption of the appliance, of which the operational state has been modified, from the determined time-dependent total admittance Y(t) and the determined time-dependent mains voltage V(t). In particular, the determination unit 9 can be adapted to determine a time-dependent change in the total admittance Y by using equation (1) and the measured time-dependent mains voltage V(t), which has been measured, while an appliance is switched.

The appliance determination unit can therefore be adapted to determine the appliance, which has been switched on or switched off, based on time-dependent characteristics and/or non-time-dependent characteristics of admittances of the appliances 3, 4, 5 of the electrical network, wherein preferentially corresponding characteristics are stored in the memory of the appliance determination unit. For example, for each appliance a waveform $Y_1(t)$, $Y_2(t)$, $Y_3(t)$ of the respective admittance after the respective appliance has been switched on or switched off can be stored in the memory. These waveforms can be compared with an actually determined waveform Y(t) of the total admittance, in order to determine which appliance has been switched on or switched off. For example, a similarity measure like a correlation can be used for comparing the stored waveforms of the different appliances with the actually determined waveform of the total admittance, wherein whether a stored waveform is similar to the actually determined waveform of the total admittance can be determined by, for example, thresholding the result of applying the similarity measure.

The stored non-time-dependent characteristics of the admittances of the appliances are preferentially mean values at the plateaus shown in FIG. 2, i.e. for the first appliance 3 a mean value of 0.04 siemens and for the second appliance 4 a mean value of 0.02 siemens can be stored in the memory of the appliance determination unit 9.

The appliance determination unit 9 is further adapted to determine the energy consumption of the appliance depending on an integral over time of a product of the squared time-dependent mains voltage V(t) and the time-dependent total admittance Y(t) in accordance with following equation:

$$E = \int V(t)^2 Y(t) dt \quad (3)$$

wherein E indicates the energy consumed by one or several appliances, which have been identified by the appliance determination unit 9 as being switched on.

The disaggregation apparatus 1 may optionally comprise a current generation unit 11, which is indicated in FIG. 1 as dotted circle. In another embodiment, the optional current generation unit 11 may be part of the electrical network 2 and not of the disaggregation apparatus 1. The current generation unit 11 is an additional power source, which is connected to the electrical network 2 for supplying voltage and, thus, current to the appliances 3, 4, 5 at an additional frequency being different to the mains voltage frequency which is generally 50 Hz in Europe and 60 Hz in the United States. The additional frequency is, for example, 10 Hz or 100 Hz.

The voltage meter 7 is adapted to measure the first change in the mains voltage delivered to the appliances 3, 4, 5 of the electrical network 2, while the operational state of the appliance is modified, at the mains voltage frequency. If the optional current generation unit 11 is present, the voltage meter 7 is preferentially further adapted to measure a first additional change of voltage in the electrical network 2, while the operational state of an appliance is modified, at the additional frequency. The voltage meter 7 is further adapted to measure the second change in the mains voltage delivered to the appliances 3, 4, 5 of the electrical network 2, while the switchable load 8 is switched, at the mains voltage frequency and, if the current generation unit 11 is present, to measure a second additional change of voltage in the electrical network 2, while the operational state of the switchable load 8 is switched, at the additional frequency. Moreover, in an embodiment comprising the current generation unit 11, the appliance determination unit 9 is adapted to determine the appliance, of which the operational state has been changed, based on the measured first change in the mains voltage, the measured first additional change of voltage in the electrical network 2, the measured second change in the mains voltage, the measured second additional change of voltage in the electrical network 2 and the resistance of the switchable load 8. In this embodiment, the appliance determination unit 9 is further adapted to determine a change in the total admittance at the mains voltage frequency and at the additional frequency and to determine the appliance, of which the operational state has been changed, based on the change in total admittance determined at the mains voltage frequency and at the additional frequency. This allows determining the appliance, of which the operational state has been changed, based on the frequency dependence of the determined change in total admittance. The frequency dependence of the change in the total admittance can be indicative of the respective appliance, of which the operational state has been changed. In the embodiment, which comprises the current generation unit 11, the appliance determination unit 9 comprises a memory in which the frequency dependences of the admittances of the appliances 3, 4, 5 of the electrical network 2 are stored. By comparing the frequency dependence of the change of the total admittance with the stored frequency dependencies of the admittances of the appliances 3, 4, 5, one or several appliances can be determined of which the operational state has been modified.

Also in the embodiment, which comprises the current generation unit 11, the change in total admittance is preferentially determined in accordance with equations (1) and (2), wherein in this embodiment the change in total admittance is determined twice in accordance with these equations, at the mains voltage frequency depending on $\Delta_1(1/V)$ and $V_0/Z_0$, each determined at the mains voltage frequency, and at the additional frequency depending on $\Delta_1(1/V)$ and on $V_0/Z_0$, each determined at the additional frequency. If the ratio $V_0/Z_0$ is the same for the mains voltage frequency and the additional frequency, this ratio is only determined for one of these frequencies.

The current generation unit can be regarded as a means to emit a tone at the additional frequency that is different from the mains voltage frequency. The consideration of the additional frequency may allow for a further improved determination of an appliance, of which the operational state has been modified, in particular, which has been switched on or switched off.

Figure 3:
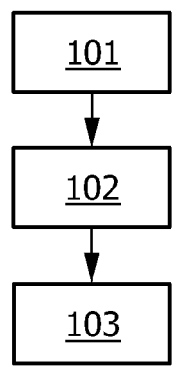
FIG. 3 shows a flowchart exemplarily illustrating an embodiment of a disaggregation method for identifying an appliance in an electrical network.

In the following an embodiment of a disaggregation method for identifying an appliance of an electrical network will exemplarily be described with reference to a flowchart shown in FIG. 3.

In step 101, a first change in the mains voltage V delivered to the appliances 3, 4, 5 of the electrical network 2 is measured, while an operational state of an appliance is modified. In step 102, a second change in the mains voltage V delivered to the appliances 3, 4, 5 of the electrical network 1 is measured, while the switchable load 8 is switched, and, in step 103, the appliance, of which the operational state has been changed, is determined based on the measured first change in the mains voltage, the measured second change in the mains voltage and the resistance R of the switchable load 8.

Step 102 can be performed before step 101. In an embodiment, firstly step 102 is performed and the ratio $V_0/Z_0$ is determined, and then steps 101 and 103 are repeatedly performed with the same determined ratio $V_0/Z_0$ as described above. If the electrical network is not very stable, step 102 can be performed repeatedly at certain time intervals or on demand, in order to update the ratio $V_0/Z_0$.

Known centralized methods for disaggregating the consumed electrical energy by a number of appliances often involve both a current meter, which measures the total current and which must be clamped around a wire inside an electrical cabinet, and a voltage meter, which measures the mains voltage. Installing the current meter is a non-trivial task, which should be performed by a trained professional. This is a disadvantage of these methods, especially in a home environment.

The disaggregation apparatus described above with reference to FIG. 1 does not require a current meter. The disaggregation apparatus can be installed by a user in any socket and, thus, requires minimal change in existing electricity infrastructure.

The article by Shwetak N. Patel et al. described above discloses a method which uses voltage only to identify appliances and their on and off events. However, the method relies on detecting and classifying switching flickers that have very short time durations and as such require high sampling rates and continuous monitoring. Moreover, this method does not support determining the energy consumption of the different appliances. In contrast, the disaggregation apparatus described above with reference to FIG. 1 allows inferring appliances and/or appliance-states, including their associated energy consumption values, very efficiently.

The voltage meter can be adapted to measure the first change in the mains voltage delivered to the appliances of the electrical network at regular time intervals, in order to monitor the operational states of the appliances, in particular, in order to monitor whether an appliance has been switched on or switched off. The measurement result can be sent to a buffer memory which stores the measurement result. The appliance determination unit performs the disaggregation by determining an appliance, of which the operational state has been changed, based on the measured first change in the mains voltage. The appliance determination unit can comprise a signal processing unit which performs the disaggregation, i.e., for example, which determines the appliance, of which the operational state has been changed, based on the measured first change in the mains voltage. The controller can be adapted to switch the switchable load on and/or off, either at regular intervals, or when asked for by the appliance determination unit, in particular, by the processing unit.

The principal upon which the disaggregation apparatus and the disaggregation method are based is that each appliance has its own characteristic current pattern, which may be modelled as an admittance pattern, in particular, as a time-dependent admittance pattern. Because of the internal impedance of the electrical network, switching on a load leads to a drop of the mains voltage. From the voltage drop patterns, it can be inferred which appliance was switched on, what the appliance's admittance is and how much energy it consumes.

The disaggregation apparatus and method are preferentially used for home monitoring and for disaggregating energy usage.

Although in the embodiment described above with reference to FIG. 1 the electrical network comprises three appliances, the electrical network can of course comprise more or less than three appliances.

Although in the embodiment described above with reference to FIG. 1 the disaggregation apparatus comprises a switchable load which is controlled by a controller of the disaggregation apparatus, alternatively the switchable load can be an element of the electrical network, for example, one of the appliances of the electrical network. Even if the switchable load is not comprised by the disaggregation apparatus, but by the electrical network, the controller is adapted to switch the switchable load.

Although in an embodiment described above with reference to FIG. 1 the voltage meter measures a first additional change of voltage in the electrical network, while the operational state of the appliance is modified, at an additional frequency being different to the mains frequency and the appliance determination unit is adapted to determine the appliance, of which the operational state has been changed, based on the measured first change in the mains voltage, the measured first additional change of voltage in the electrical network, the measured second change in the mains voltage and the resistance of the switchable load, if a current generation unit generates a current in the electrical network at the additional frequency, this measurement in this determination at the additional frequency can also be performed, if the current generation unit for generating a current in the electrical network at the additional frequency is not present. Also the second additional change of voltage in the electrical network, while the operational state of the switchable load is switched, at the additional frequency can be measured, if the current generation unit is not present.

Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality.

A single unit or device may fulfill the functions of several items recited in the claims. The mere fact that certain measures are recited in mutually different dependent claims does not indicate that a combination of these measures cannot be used to advantage.

Determinations like the determination of an appliance of the electrical network, of which the operational state has been changed, the determination of the energy consumption of an appliance, the determination of the ratio $V_0/Z_0$, et cetera performed by one or several units or devices can be performed by any other number of units or devices. The determinations and/or the control of the disaggregation apparatus in accordance with the above described disaggregation method can be implemented as program code means of a computer program and/or as dedicated hardware.

A computer program may be stored/distributed on a suitable medium, such as an optical storage medium or a solid-state medium, supplied together with or as part of other hardware, but may also be distributed in other forms, such as via the Internet or other wired or wireless telecommunication systems.

Any reference signs in the claims should not be construed as limiting the scope.

The invention relates to a disaggregation apparatus for indentifying an appliance in an electrical network comprising multiple appliances. A voltage meter measures a first change in a mains voltage delivered to the appliances of the electrical network, while an operational state of an appliance is modified, and a second change in the mains voltage, while a switchable load is switched. An appliance determination unit determines the appliance, of which the operational state has been changed, based on the measured first change in the mains voltage, the measured second change in the mains voltage and the resistance of the switchable load. Thus, an appliance can be determined without detecting switching flickers in very short time durations, i.e. high sampling rates and continuous monitoring are not necessarily required. This reduces the technical efforts of the disaggregation apparatus for performing the disaggregation function.

The invention claimed is:

1. A disaggregation apparatus for identifying an appliance in an electrical network, which comprises multiple appliances and which is powered by a power source, the disaggregation apparatus comprising:
   a voltage meter for measuring a first change in a mains voltage (V) delivered to the appliances of the electrical network, while an operational state of an appliance is modified,
   a controller for switching a switchable load, wherein the switchable load has a known resistance and the switchable load does not comprise the appliance and wherein the switchable load is parallelly connected to the appliance, and wherein the voltage meter is adapted to measure a second change in the mains voltage (V)

delivered to the appliances of the electrical network, while the switchable load is switched, an appliance determination unit for determining a characteristic of the appliance, of which the operational state has been changed, based on the measured first change in the mains voltage (V), the measured second change in the mains voltage (V) and the resistance (R) of the switchable load and for determining the appliance by comparing the determined characteristic with characteristics stored in a memory, wherein the appliance determination unit is adapted to determine a change ($\Delta Y$) in a total admittance (Y) of the electrical network of the appliances from the measured first change in the mains voltage (V) and from a ratio of a voltage ($V_0$) supplied by the power source and an impedance ($Z_0$) of the electrical network, wherein the ratio is determined from the measured second change in the mains voltage (V) and the resistance (R) of the switchable load, and to determine the appliance, of which the operational state has been changed, based on the determined change ($\Delta Y$) in total admittance, wherein the appliance determination unit is adapted to determine from the measured first change in the mains voltage (V) a first change ($\Delta_1(1/V)$) in the reciprocal mains voltage (1/V), and to determine the change ($\Delta Y$) in the total admittance depending on the product of the ratio and the first change ($\Delta_1(1/V)$) in the reciprocal mains voltage (1/V), wherein the appliance determination unit is adapted to determine from the measured second change in the mains voltage (V) a second change ($\Delta_2(1/V)$) in the reciprocal mains voltage (1/V), and to determine the ratio depending on the product of the resistance (R) of the switchable load and the second change ($\Delta_2(1/V)$) in the reciprocal mains voltage (1/V).

2. The disaggregation apparatus as defined in claim 1, wherein the voltage meter is adapted for measuring the mains voltage (V) delivered to the appliances of the electrical network over time for measuring a time-depending mains voltage (V(t)) and wherein the appliance determination unit is adapted to determine the total admittance (Y) of the electrical network of appliances over time from the measured time-dependent mains voltage (V(t)) and the ratio of the voltage ($V_0$) supplied by the power source and the impedance ($Z_0$) of the electrical network for determining a time-dependent total admittance (Y(t)), and determine the energy consumption of the appliance, of which the operational state has been modified, from the determined time-dependent total admittance (Y(t)) and the determined time-dependent mains voltage (V(t)).

3. The disaggregation apparatus as defined in claim 2, wherein the appliance determination unit is adapted to determine the energy consumption of the appliance depending on an integral over time of a product of the squared time-dependent mains voltage (V(t)) and the time-dependent total admittance (Y(t)).

4. The disaggregation apparatus as defined in claim 1, wherein the disaggregation apparatus comprises the switchable load.

5. The disaggregation apparatus as defined in claim 1, wherein the voltage meter is adapted to measure the first change in the mains voltage (V) delivered to the appliances of the electrical network, while the operational state of the appliance is modified, at a mains voltage frequency and to measure a first additional change of voltage in the electrical network, while the operational state of the appliance is modified, at an additional frequency being different to the mains frequency, and the appliance determination unit is adapted to determine the appliance, of which the operational state has been changed, based on the measured first change in the mains voltage (V), the measured first additional change of voltage in the electrical network, the measured second change in the mains voltage (V) and the resistance (R) of the switchable load.

6. The disaggregation apparatus as defined in claim 5, wherein the voltage meter is adapted to measure the second change in the mains voltage (V) delivered to the appliances of the electrical network, while the switchable load is switched, at the mains voltage frequency and to measure a second additional change of voltage in the electrical network, while the operational state of the switchable load is switched, at the additional frequency, the appliance determination unit is adapted to determine the appliance, of which the operational state has been changed, based on the measured first change in the mains voltage (V), the measured first additional change of voltage in the electrical network, the measured second change in the mains voltage (V), the measured second additional change of voltage in the electrical network and the resistance (R) of the switchable load.

7. The disaggregation apparatus as defined in claim 5, wherein the disaggregation apparatus comprises a current generation unit for generating a current in the electrical network at the additional frequency.

8. A system comprising an electrical network, which comprises multiple appliances and which is powered by a power source, and a disaggregation apparatus for identifying an appliance in the electrical network as defined in claim 1.

9. A disaggregation method for identifying an appliance in an electrical network, which comprises multiple appliances and which is powered by a power source, the disaggregation method comprising:

measuring a first change in a mains voltage (V) delivered to the appliances of the electrical network, while an operational state of an appliance is modified, measuring a second change in the mains voltage (V) delivered to the appliances of the electrical network, while a switchable load is switched, wherein the switchable load has a known resistance and wherein the switchable load does not comprise the appliance and wherein the switchable load is parallelly connected to the appliance, determining a characteristic of the appliance, of which the operational state has been changed, based on the measured first change ($\Delta V$) in the mains voltage (V), the measured second change in the mains voltage (V) and the resistance (R) of the switchable load and determining the appliance by comparing the determined characteristic with characteristics stored in a memory, wherein a change ($\Delta Y$) in a total admittance (Y) of the electrical network (2) of the appliances is determined from the measured first change in the mains voltage (V) and from a ratio of a voltage ($V_0$) supplied by the power source and an impedance ($Z_0$) of the electrical network, wherein the ratio is determined from the measured second change in the mains voltage (V) and the resistance (R) of the switchable load (8), the appliance, of which the operational state has been changed, is determined based on the determined change ($\Delta Y$) in total admittance, wherein from the measured first change in the mains voltage (V) a first change ($\Delta_1(1/V)$) in the reciprocal mains voltage (1/V) is determined, and the change ($\Delta Y$) in the total admittance is determined depending on the product of the ratio and the first change ($\Delta_1(1/V)$) in the reciprocal mains voltage (1/V), wherein from the measured second change in the mains voltage (V) a second change ($\Delta_2(1/V)$) in the reciprocal mains voltage (1/V) is determined, and the ratio is determined depending on the product of the resistance (R) of the switchable load and the second change ($\Delta_2(1/V)$) in the reciprocal mains voltage (1/V).

* * * * *